(12) United States Patent
Ishihara et al.

(10) Patent No.: US 8,508,978 B2
(45) Date of Patent: Aug. 13, 2013

(54) SEMICONDUCTOR MEMORY DEVICE

(75) Inventors: Kazuya Ishihara, Osaka (JP); Mitsuru Nakura, Osaka (JP); Yoshiji Ohta, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 322 days.

(21) Appl. No.: 13/114,507

(22) Filed: May 24, 2011

(65) Prior Publication Data
US 2011/0292715 A1 Dec. 1, 2011

(30) Foreign Application Priority Data

May 26, 2010 (JP) .................................. 2010-119948

(51) Int. Cl.
*G11C 11/00* (2006.01)
(52) U.S. Cl.
USPC .......................................... 365/148; 365/158
(58) Field of Classification Search
USPC .......................................... 365/148, 158, 163
See application file for complete search history.

(56) References Cited

U.S. PATENT DOCUMENTS

| 6,608,776 | B2 | 8/2003 | Hidaka |
| 8,139,395 | B2 * | 3/2012 | Kotaki et al. ................ 365/148 |
| 8,189,371 | B2 * | 5/2012 | Katsumata et al. .......... 365/161 |
| 2004/0130939 | A1 | 7/2004 | Morikawa |
| 2008/0123392 | A1 | 5/2008 | Kinoshita |
| 2010/0080038 | A1 | 4/2010 | Awaya et al. |

FOREIGN PATENT DOCUMENTS

| JP | 2002-151661 | 5/2002 |
| JP | 2004-185755 | 7/2004 |
| JP | 2010-80718 | 4/2010 |
| WO | WO 2006/137110 | 12/2006 |

* cited by examiner

*Primary Examiner* — Vu Le
(74) *Attorney, Agent, or Firm* — Nixon & Vanderhye, P.C.

(57) ABSTRACT

A semiconductor memory device includes a memory cell array in which a plurality of memory cells is aligned in a matrix shape, each memory cell including a two-terminal memory element and a transistor for selection connected in series; a first voltage applying circuit that applies a writing voltage pulse to first bit lines; and a second voltage applying circuit that applies a pre-charge voltage to the first bit lines and second bit lines, wherein in a writing of a memory cell, after the second voltage applying circuit has pre-charged both ends of the memory cell to a same voltage, the first voltage applying circuit applies the writing voltage pulse via the first bit line that is directly connected to the transistor for selection, and the second voltage applying circuit applies the pre-charge voltage to the second bit line directly connected to the memory element.

8 Claims, 14 Drawing Sheets

SEMICONDUCTOR MEMORY DEVICE

CROSS REFERENCE TO RELATED APPLICATION

This Nonprovisional application claims priority under 35 U.S.C. §119(a) on Patent Application No. 2010-119948 filed in Japan on 26 May, 2010 the entire contents of which are hereby incorporated by reference.

BACKGROUND OF THE INVENTION

1. Field of the Invention

The present invention relates to a semiconductor memory device, and in particular to a semiconductor memory device that writes information stored based on the resistance state of a variable resistive element in memory cells by applying a voltage pulse.

2. Description of the Related Art

In recent years new types of nonvolatile semiconductor memory devices for replacing flash memories have been widely researched. In particular, RRAM's using the change in the resistance when a voltage is applied to a variable resistive film, such as of a transition metal oxide, have an advantage in that there are less limitations in terms of how much they can be miniaturized in comparison with flash memories, and make it possible to write data at a high speed, and thus, research and development are being actively carried out.

As shown in Japanese Unexamined Patent Publication 2002-151661, the conventional structure of memory cell arrays using RRAM's is of a 1T1R type, which can prevent a leak current and a roundabout current from flowing through unselected memory cells when information stored in the variable resistive element in the selected memory cell is written and read out by connecting a transistor for selecting a cell to the variable resistive element of the memory cells in series.

FIG. 12 shows the configuration of the cell array of conventional RRAM's. In the memory cell array 200, variable resistive elements R11 to R1$n$, R21 to R2$n$ and so on, and transistors for selecting a cell Q11 to Q1$n$, Q21 to Q2$n$ and so on are aligned in a matrix shape in the column direction (lateral direction in the figure) and the row direction (longitudinal direction in the figure). In each memory cell, a first end of the variable resistive element and a first end of the transistor are connected, a second end of the variable resistive element of memory cells aligned in the same column is connected to a bit line BL1, BL2 and so on, which run in the column direction, a second end of the transistor of memory cells aligned in the same row is connected to the common line CML, which is shared by all the memory cells, and word lines WL1 to WLn, which run in the row direction, are respectively connected to the gate terminals of the transistors in the memory cells aligned in the same row.

External power supply lines V1 and V2 for supplying a writing voltage are connected so that the voltage in the power supply line V1 and the voltage in the power supply line V2 are applied to the bit lines BL1, BL2 and so on, and the common line CML, respectively, via the transistors in the writing voltage applying circuit 201. In addition, bit lines BL1, BL2 and so on, and the common line CML are connected via the transistors in the initialization circuit 202, and the voltage is applied to the bit lines from the common line, so that it is possible to initialize the voltage of bit lines that become of a previous writing operation voltage state due to the effects of the parasitic capacitance between wires, for example between bit lines and variable resistive elements connected to the bit lines.

FIG. 13 shows the timing chart upon writing the variable resistive element R11 shown in FIG. 12. Hereinafter the operation for lowering the resistance of the variable resistive element is referred to as setting (programming), through which the current flowing through the memory cell increases, and the operation for raising the resistance of the variable resistive element is referred to as resetting (erasing), through which the current flowing through the memory cell is made small. The definition of setting and resetting may, of course, be the opposite. In addition, combined operation of setting and resetting is referred to as writing.

At time t1, the voltage applied to the word line WL1 is raised to a voltage $V_{WLS}$ (typically 4 V) at the time of setting and to a voltage $V_{WLR}$ (typically 6 V) at the time of resetting, and after that, at time t2, φ1, φ2 and φ5 are raised, and the initialization operation is carried out. That is to say, the voltage of the power supply line V1 is applied to the selected bit line BL1 and the voltage of the power supply line V2 is applied to the common line CML via the transistors in the writing voltage applying circuit 201, and furthermore, the same voltage as for the common line CML is applied to the unselected bit lines BL2 and so on via the transistors in the initialization circuit 202, so that the voltage of the unselected bit lines is initialized. At this time, the voltage of the power supply lines V1 and V2 is the same initialization voltage $V_{PRE}$ (typically 1.5 V), and as a result, the common line CML and all of the bit lines BL1, BL2 and so on are pre-charged to the same voltage $V_{PRE}$.

After that, at time t5 to t6, a writing voltage pulse is applied to the power supply lines V1 and V2. That is to say, at the time of setting, the voltage in the power supply line V1 is converted to a voltage $V_{SET}$ (typically 3V) and the voltage in the power supply line V2 is converted to GND, so that a current flows from the selected bit line BL1 to the common line CML via R11 and Q11. Meanwhile, at the time of resetting, the voltage in the power supply line V1 is converted to GND and the voltage of the power supply line V2 is converted to a voltage $V_{RST}$ (typically 3 V), so that a current flows from the common line CML to the selected bit line BL1 via Q11 and R11.

Although in the array structure shown in FIG. 12, the leak current and the roundabout current can be prevented from flowing through unselected memory cells, a voltage is applied to adjacent unselected memory cells when writing is repeated in the selected memory cell, and thus, a so-called writing disturbance, where information in adjacent memory cells is written, cannot be prevented. Writing disturbances can be divided into three categories in accordance with its cause. In the following, the three types of writing disturbances are described in reference with FIG. 12, which shows the array structure, and FIG. 13, which is a timing chart for the writing.

First, the first type of writing disturbance is "selected bit line disturbance", which is caused in unselected variable resistive elements R12 to R1$n$ which are connected to the selected bit line BL1 when the writing voltage pulse is applied to the power supply line V1 at time t5, so that the voltage in the selected bit line BL1 changes. For example, in the unselected variable resistive element R12, there is a parasitic capacitance, although small, in the connection point node #A between the variable resistive element R12 and the cell transistor Q12. Since the transistor Q12 connected to the unselected word line WL2 is turned off, the node #A is connected only to the selected bit line BL1 via the variable resistive element R12. Accordingly, when the voltage of the selected bit line BL1 fluctuates, this fluctuation is conveyed to the node #A with a delay of time constant RC (typically 10 ns), which is determined by the resistance value R of the variable resistive element R12 (typically 1 MΩ when the RRAM is in a high resistance state) and the parasitic capacitance C at the node #A (typically 10 fF). Therefore, there is a difference in potential which corresponds to the delay in the voltage fluctuation between the two ends of the variable resistive element R12.

Next, the second type of writing disturbance is "unselected bit line disturbance", which is caused in variable resistive elements R22 to R2n and so on connected to the unselected bit lines BL2 and so on. This is because φ5 remains high when the writing voltage pulse is applied to the power supply line V2 at time t5, so that the voltage in the common line CML changes, and therefore, the voltage in the unselected bit lines BL2 and so on changes to the same voltage as in the common line CML. In the variable resistive element R22, there is a parasitic capacitance C, although small, at the connection point node #B between the variable resistive element R22 and the transistor Q22. Since the transistor Q22 connected to an unselected word line WL2 is turned off, the node #B is connected only to the unselected bit line BL2 via the variable resistive element R22. Accordingly, when the voltage of the unselected bit line BL2 fluctuates, this fluctuation is conveyed to the node #B with a delay in the time constant RC (typically 10 ns), which is determined by the resistance value R of the variable resistive element R22 (typically 1 MΩ when the RRAM is in a high resistance state) and the parasitic capacitance C at the node B (typically 10 fF). Therefore, there is a difference in potential which corresponds to the delay in the voltage fluctuation between the two ends of the variable resistive element R22.

FIG. 14 shows bit line noise 203 caused by the selected bit line disturbance or unselected bit line disturbance, which is the absolute value of the voltage fluctuation that is applied across the two ends of the variable resistive element R12 or R22. These are the results of a simulation for a case where a writing voltage pulse of +2V is applied to the selected bit line BL1 or the unselected bit line BL2 for 50 ns with an initialization time of 2 ns, and it is clear from this that a pulse with a peak voltage of 1.8 V having a width of 10 ns at half height is also applied to unselected memory cells. This is sufficiently large disturbance in comparison with the width of the writing pulse applied to selected cells, which is approximately 50 ns.

In order to prevent "unselected bit line disturbance", which is the second type of writing disturbance, it is desirable to make the voltage fluctuation in non-selected bit lines via the common line as soft as possible. However, the delay in the conveyance of the signal between wires causes a difference in the change in voltage between unselected bit lines BL2 and so on and the common line CML, and as a result, the difference in potential is applied to variable resistive elements R21 and so on aligned in the row direction along the selected word line WL1. This is because the cell transistors Q21 and so on connected to the selected word line WL1 are turned on in these variable resistive elements. For example, the voltage fluctuation in the unselected bit line BL2 via the common line is conveyed to the node #C with a delay of time constant RC (typically 1 μs), which is determined by the resistance value R in the variable resistive element R21 (typically 1 MΩ) when the RRAM is in a high resistance state) and the parasitic capacitance C between wires (typically 1 pF). As a result, a difference in potential that corresponds to the delay in the voltage fluctuation between the unselected bit line BL2 and the common line CML is applied across the two ends of the variable resistive element R21.

This is the third type of writing disturbance, which is hereinafter referred to as "common line disturbance". Common line noise 204 in FIG. 14 shows the absolute value of the voltage fluctuation that is applied across the two ends of the variable resistive element R21 in the case where the voltage fluctuation of the unselected bit lines is very slow. These are the results of a simulation for a case where a writing voltage pulse of +2 V having an time for initialization of 2 ns is applied to the common line for 50 ns, where the writing voltage ends up being applied to unselected memory cells for a long period of time. As is clear from the above, "the common line disturbance" and "the unselected bit line disturbance" are related in that when one is suppressed the other grows, and therefore, it is very difficult to provide a design that is appropriate to suppress both.

As a measure for suppressing the above describe disturbances, Japanese Unexamined Patent Publication 2004-185755 discloses a method according to which the transistors of individual memory cells are connected to bit lines and the variable resistive elements of individual memory cells are connected to the common line (source line), so that a writing voltage pulse can be applied from the bit line side. In this method, although the disturbance can be suppressed in the case where a writing voltage pulse is applied from the bit line side, the disturbance cannot be suppressed in the case where a writing voltage pulse is applied from the common line side. Particularly in the case where variable resistive elements having bipolar properties are used for storing information, the setting operation and the resetting operation are carried out by applying a voltage pulse of a different polarity, and therefore, it becomes necessary to apply a writing voltage pulse from the common line side, and in this case, the writing disturbance cannot be suppressed completely.

In order to completely suppress the disturbances, two cell transistors for selecting a memory cell are provided and connected to the two ends of the variable resistive element in the memory cell, as shown in FIG. 4 in Japanese Unexamined Patent Publication 2004-185755. However, three elements are required per cell, and the area for the cell array becomes large.

Incidentally, semiconductor memory devices using variable resistive elements for storing information are expected to be used as nonvolatile memories for storing digital camera images and nonvolatile memories for cellular phones and other electronics. When used as a nonvolatile memory for a digital camera, however, it is necessary to keep the chip area small in order to lower the cost per bit. Furthermore, even a one-pixel error lowers the quality of the image stored in the nonvolatile memory, and therefore, the reliability of the data must be kept high when stored. Moreover, the reliability of the data must be kept high when stored for a long period of time. In addition, when used as a nonvolatile memory in other electronics, for example in a cellular phone, a communication protocol is recorded together with image data, and therefore, the data has to be highly reliable.

That is to say, although it is desired for the above-described semiconductor memory device to be put into practice as a nonvolatile memory which is highly reliable when written, the writing disturbance cannot be suppressed without increasing the cell array area as long as the memory cell array has a conventional structure, and thus, a highly reliable nonvolatile memory cannot be implemented while preventing the cell array area from being large.

SUMMARY OF THE INVENTION

An object of the present invention is to provide a highly reliable semiconductor memory device where writing disturbances can be suppressed in a 1T1R type memory cell array where each cell has one memory element and one cell transistor, without increasing the number of elements per cell.

A semiconductor memory device of the present invention for achieving the above object comprises a first aspect of comprising a memory cell array including a plurality of memory cells arranged in a matrix shape in a row direction and a column direction, each memory cell comprising a memory element and a cell transistor, wherein the memory element has two input/output terminals so that information is stored using a difference in electrical properties between the two terminals and the stored information is written by applying a writing voltage across the two terminals, the cell transistor has two input/output terminals and one control terminal, and a first end of the input/output terminals of the memory element and the first end of the input/output terminals of the cell transistor are connected; word lines extending in the row direction for connecting the control terminals of the cell transistors in the memory cells arranged in the same rows to each other; first bit lines extending in the column direction for connecting second ends of the input/output terminals of the cell transistors in the memory cells arranged in the same columns to each other, the second ends of the input/output terminals of the cell transistors being not connected to the memory elements; second bit lines extending in the column direction for connecting the second ends of the input/output terminals of the memory elements in the memory cells to each other, the second ends of the input/output terminals of the memory elements being not connected to the cell transistors; a word line voltage applying circuit for applying a voltage to the word line connected to the memory cell selected to be written; a first voltage applying circuit for applying the writing voltage to the first bit line connected to the selected memory cell; and a second voltage applying circuit for applying a pre-charge voltage to both the first bit line and the second bit line connected to the selected memory cell before application of the writing voltage, and applying the pre-charge voltage to the second bit line connected to the selected memory cell while the writing voltage is applied to the first bit line connected to the selected memory cell, wherein each of the cell transistors is a vertical field effect transistor including the first end of the input/output terminals, a channel region, and the second end of the input/output terminals arranged in a third direction that is vertical to the row direction and the column direction, in each of the memory cells, the memory element and the cell transistor are arranged in the third direction, and the word lines, the first bit lines, and the second bit lines are formed apart from each other in the third direction.

According to the semiconductor memory device of the above first aspect, upon the writing operation of the selected memory cell, the writing voltage pulse is applied by the first voltage applying circuit from the first bit line side to which the cell transistor of the memory cell is connected. At this occasion, a predetermined pre-charge voltage is applied beforehandedly to the second bit line connected to the memory element of the selected memory cell, and since the application of this pre-charge voltage is maintained throughout the writing operation, a writing disturbance to unselected memory cells along the second bit line is prevented.

Further, since the first bit lines and the second bit lines extend in parallel and the first bit line to which the writing voltage is to be applied crosses the word lines orthogonally, a writing disturbance to the unselected memory cells via the selected word lines is prevented.

Further, by configuring the selected transistor with the vertical transistor, an increase in a cell array area, which is caused due to extending the first bit lines and the second bit lines in parallel, is prevented.

Further, the semiconductor memory device of the present invention may comprise, in addition to the above first aspect, a second aspect in which each of the first bit lines includes a diffusion layer.

Further, the semiconductor memory device of the present invention may comprise, in addition to the above first or second aspect, a third aspect in which the cell transistor is a surround-gate transistor including a source region, a drain region, the channel region having a tube shape, a tube-shaped gate insulating film covering an outer circumferential wall surface of the channel region, and a gate electrode covering an outer circumferential wall surface of the gate insulating film, wherein the source region and the drain region connect to the channel region at a bottom surface and a top surface of the channel region, respectively.

Further, the semiconductor memory device of the present invention may comprise, in addition to any of the above first to third aspects, a fourth aspect in which the cell transistor connects to the first bit line at its bottom surface and connects to the first end of the input/output terminals of the memory element at its top surface, and the second end of the input/output terminals of the memory element is connected to the second bit line.

Further, the semiconductor memory device of the present invention may comprise, in addition to any of the above first to fourth aspects, a fifth aspect in which the second voltage applying circuit includes a pre-charge power supply line to which the pre-charge voltage is applied, and the pre-charge power supply line is directly connected to each of the second bit lines and connected to each of the first bit lines via a first transistor provided for each of the first bit lines.

According to the semiconductor memory device of the above fifth aspect, by directly connecting the second bit lines to the pre-charge power supply line and thereby applying the predetermined pre-charge voltage to the second bit lines, the writing disturbance can be prevented. Moreover, by including transistors that connect the first bit lines and the pre-charge power supply line, the first bit lines can be at the same voltage as the second bit lines only during a pre-charge period, thereby to prevent a disturbance to unselected memory cells via unselected second bit lines or the selected word line.

Further, the semiconductor memory device of the present invention may comprise, in addition to any of the above first to fifth aspects, a sixth aspect in which the first voltage applying circuit includes a writing power supply line to which the writing voltage is applied, and the writing power supply line is connected to each of the first bit lines via a second transistor provided for each of the first bit lines.

According to the semiconductor memory device of the above sixth aspect, due to the application of the writing voltage pulse from the first bit line side to which the cell transistor of the memory cell is connected, the writing disturbance to the unselected memory cells along the second bit line is prevented.

Further, the semiconductor memory device of the present invention may comprise, in addition to any of the above first to fifth aspects, a seventh aspect in which the first voltage applying circuit includes a first writing power supply line and a second writing power supply line to which the writing voltages different from the pre-charge voltage are respectively applied, the first writing power supply line is connected to each of the first bit lines via a third transistor provided for each of the first bit lines, and the second writing power supply line is connected to each of the first bit lines via a fourth transistor provided for each of the first bit lines.

According to the semiconductor memory device of the above seventh aspect, by selecting one of the writing voltage from the first writing power supply line and the writing voltage from the second writing power supply line and applying the same to the first bit line, the voltage applied to this first bit line can be switched by the third and fourth transistors; thus, for each of the plurality of memory cells that is selected in the same word line, one of the two different writing voltages can be applied simultaneously thereto, and a writing operation corresponding to a storage state of the memory cell can be performed.

Further, the semiconductor memory device of the present invention may comprise, in addition to any of the above first to seventh aspects, an eighth aspect in which each of the memory elements is a variable resistive element of which a resistance state represented by a resistance property between the two input/output terminals of the memory element transitions through the application of the writing voltage.

As for the memory element used in the semiconductor memory device of any of the above first to seventh aspects, a memory element in which information is stored using the difference in electrical properties and the stored information is written by applying a writing voltage, such as a magnetic tunnel junction element used in an MRAM, a phase change RAM (PCRAM), an OUM (Ovonic Unified Memory), or a variable resistive element used in a RRAM or the like can be used; preferably, it is especially useful with the variable resistive element used in the RRAM. Unlike other memory elements that perform writing of information using a magnetic field generated by an application of a voltage or a Joule heat, this variable resistive element performs writing by directly changing the electric resistance by the application of the writing voltage, and as such the writing disturbance surely needs to be prevented. By using the configuration of the semiconductor memory device of the present invention, a semiconductor memory device in which the writing disturbance is prevented and having a high reliability can be implemented.

Therefore, when the configuration according to the present invention is provided in a semiconductor memory device where memory elements having only two terminals across which a voltage can be applied can be used in the memory cells, and as a result, a writing disturbance is easily caused in the unselected memory cells, the disturbance can be suppressed in order to hold data with a high level of reliability, and in addition, unit memory cells can be formed of one memory cell and one cell transistor, and thus, a highly reliable semiconductor memory device can be provided at low cost.

DETAILED DESCRIPTION OF THE INVENTION

First Embodiment

Figure 1:
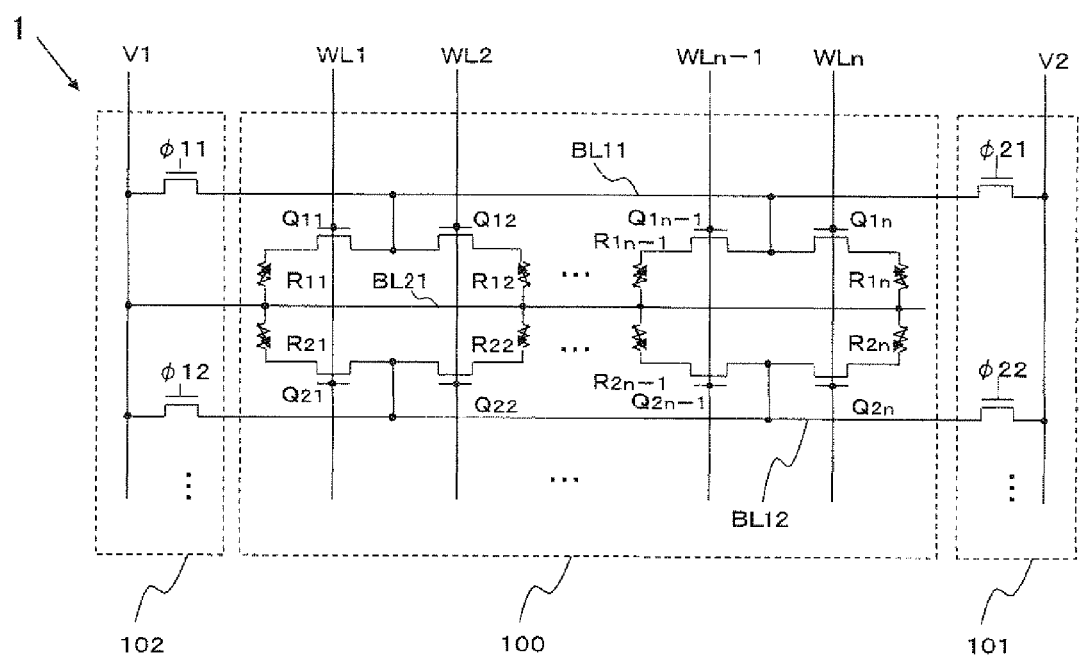
FIG. 1 is a diagram showing a circuit structure of a semiconductor memory device according to the present invention.

FIG. 1 is a diagram showing the circuit structure of the semiconductor memory device according to one embodiment of the present invention (hereinafter referred to as device of present invention 1). The device 1 of the present invention has a memory cell array 100, a first voltage applying circuit 101 and a second voltage applying circuit 102, and the memory cell array 100 is formed of variable resistive elements R11 to R1$n$, R21 to R2$n$ and so on, and transistors for selecting a memory cell Q11 to Q1$n$, Q21 to Q2$n$ and so on, which are arranged in a matrix shape in the row direction (longitudinal direction in the figure) and the column direction (lateral direction in the figure). In each memory cell, a first end of the variable resistive element and a first end of the input/output terminals of the transistor are connected. Second ends of the input/output terminals of the transistors, which are not connected to the variable resistive elements, in the memory cells arranged in the same column are connected to the first bit lines BL11, BL12 and so on, respectively, while second ends of the variable resistive elements, which are not connected to the transistors, in the memory cells arranged in the same column are connected to the second bit lines BL21 and so on, respectively. The control terminals of the transistors in the memory cells aligned in the same row are connected to respective word lines WL1 to WL$n$. During the writing/reading out operation for a memory cell within the memory cell array 100, the memory cell on which the operation is to be carried out is selected, and a selected word line voltage and a selected first bit line voltage are applied to the word line and first bit line connected to the selected memory cell, respectively, while an unselected first bit line voltage is applied to each first bit line connected to the unselected memory cells, and a pre-charge voltage is applied to the second bit lines, so that the information stored in the variable resistive element in the selected memory cell can be written and read out.

The first voltage applying circuit 101 supplies the writing voltage for writing information stored in the variable resistive element in the selected memory cell to the first bit line connected to each of the selected memory cells via the writing power supply line V2. A writing power supply line V2 and the respective first bit lines are connected via transistors for switching, so that it is possible to select a first bit line to which the writing voltage is to be applied using a switching signal φ21, φ22 and so on.

The second voltage applying circuit 102 supplies the pre-charge voltage to the first bit line and the second bit line connected to the selected memory cell via the pre-charge power supply line V1. The pre-charge power supply line V1 and the respective first bit lines are connected via transistors for switching, so that it is possible to select a first bit line to which the pre-charge voltage is to be applied using a switching signal φ11, φ12 and so on. Meanwhile, the pre-charge power supply line V1 is connected directly to the respective second bit lines, so that the pre-charge voltage is applied to all of the second bit lines. The pre-charge voltage is applied to the first bit lines, which are connected to the selected and unselected memory cells, before the writing voltage is applied via the writing power supply line V2 in the first voltage applying circuit 101 and the first bit lines, via the pre-charge power supply line V1 and the transistors for switching. As a result, in all of the unselected memory cells connected to the second bit line to which the selected memory cell is connected, the two ends of the memory cell made of a variable resistive element and a transistor can be made of the potential in advance, irrespectively of whether the memory cell is connected to the selected word line or to an unselected word line.

In addition, a word line voltage applying circuit, not shown, respectively supplies a selected word line voltage to the selected word lines WL1, WL2 and so on up to WLn connected to the selected memory cell. The word line voltage applying circuit and the respective word lines are connected via the respective transistors for switching (not shown), so that it is possible to select a word line to which the selected word line voltage is to be applied using a switching signal.

Figure 2:
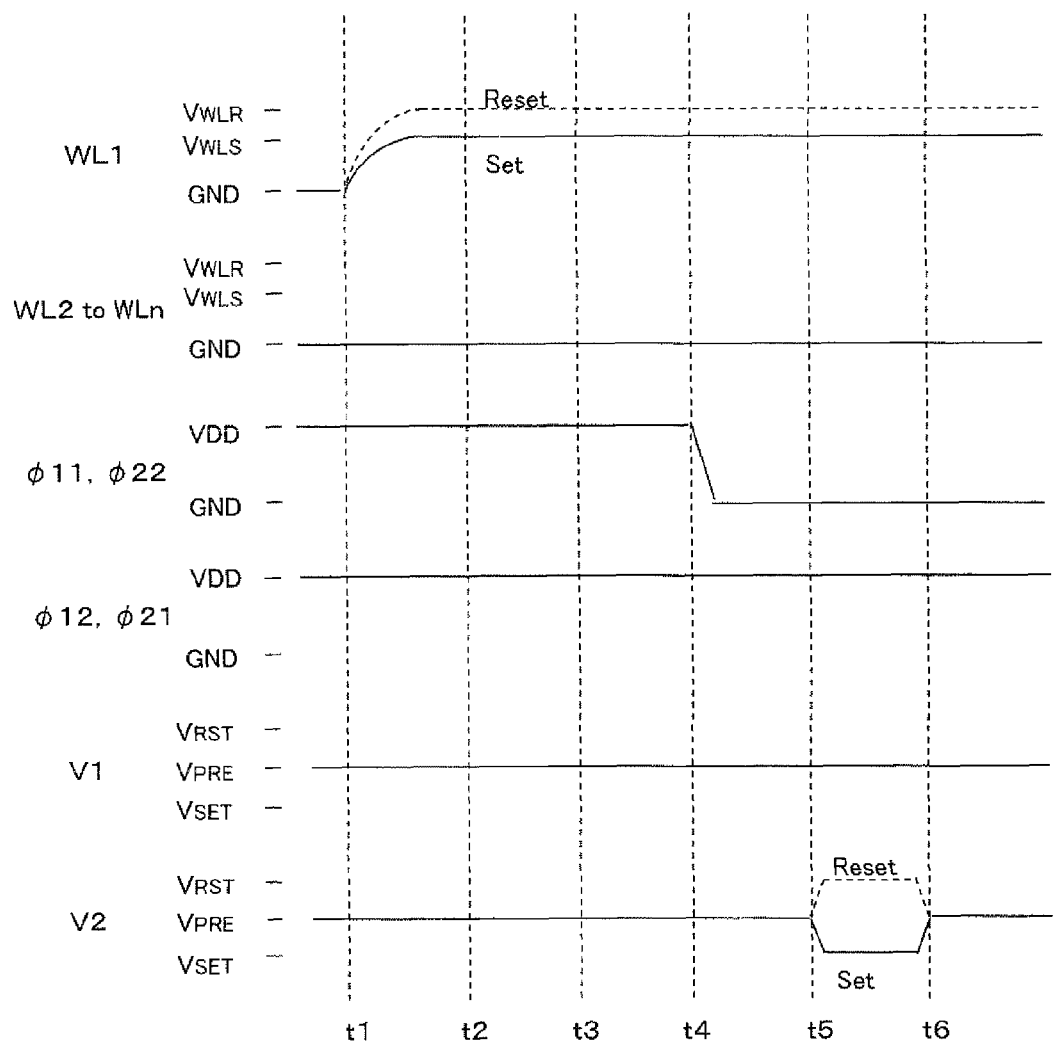
FIG. 2 is a timing chart upon writing in the semiconductor memory device according to the present invention.

FIG. 2 is a timing chart showing voltage signals in the word lines WL1 to WLn, switching signals φ11, φ12, φ21 and φ22, the pre-charge power supply line V1 and the writing power supply line V2 during writing in the device 1 of the present invention. Here, FIG. 2 shows an example of a timing chart in the case where the variable resistive element R11 in FIG. 1 is concretely written.

First, φ11, φ12 and so on up to φ21 and φ22 are raised, and a pre-charge voltage $V_{PRE}$ (typically 3 V) is applied to the first and second bit lines from the pre-charge power supply line V1 and the writing power supply line V2 via the switching transistors in the first voltage applying circuit 101 and the second voltage applying circuit 102, so that all of the memory cells are pre-charged to $V_{PRE}$ in advance.

The applied voltage to the word line WL1 is raised to a voltage $V_{WLS}$ (typically 4 V) in the case of setting, and to a voltage $V_{WLR}$ (typically 9 V) in the case of resetting at time t1, and after that, φ11 and φ22 are lowered at time t4, so that the pre-charging operation is completed. Next, a writing voltage pulse is applied to the writing power supply line V2 at time t5 to t6. That is to say, at the time of setting, the applied voltage to the writing power supply line V2 is changed to a voltage $V_{SET}$ (typically 0 V) so that a current flows from the selected second bit line BL21 to the selected first bit line BL11 via R11 and Q11. Meanwhile, at the time of resetting, the applied voltage to the writing power supply line V2 is changed to a voltage $V_{RST}$ (typically 6 V), so that a current flows from the selected first bit line BL11 to the selected second bit line BL21 via Q11 and R11.

In the writing method for the device 1 of the present invention shown in FIG. 2, three types of writing disturbances which are difficult to suppress in the prior art can all be suppressed, as described below.

The first type of writing disturbance is "selected bit line disturbance." The second bit lines BL21 and so on in the device 1 of the present invention correspond to conventional bit lines, and the "selected bit line disturbance" is caused in the memory cells R12 to R1n and R21 to R2n arranged in the column direction in the case where the voltage of the second bit line BL21 fluctuates in the structure of the present invention. However, the second bit line BL21 is connected directly to the pre-charge power supply line V1 in the second voltage applying circuit 102, and as is clear from the writing timing in FIG. 2, a constant voltage $V_{PRE}$ is continuously supplied to the pre-charge power supply line V1 during the writing operation, and therefore, the voltage in the second bit line B21 does not fluctuate. Accordingly, no "selected bit line disturbance" is caused.

Next, concerning "unselected bit line disturbance", which is the second type of writing disturbance, the second bit lines are connected to the pre-charge power supply line V1, irrespectively of whether they are selected or not, in the device 1 of the present invention, so that a constant voltage $V_{PRE}$ is applied during the writing operation, and thus, the voltage of the second bit lines does not fluctuate. Accordingly, "unselected bit line disturbance" is also not caused as well as the "selected bit line disturbance".

Furthermore, concerning "common line disturbance", which is the third type of writing disturbance, the first bit lines BL11, BL12 and so on in the device 1 of the present invention correspond to conventional common lines, and these are not wires shared by all of the memory cells, unlike the common lines in conventional circuits, but respectively connected to the writing power supply line V2 via the transistors in the first voltage applying circuit 101. In addition, as is clear from the writing timing in FIG. 2, φ22 is lowered before the writing voltage pulse is applied, and therefore, the voltage pulse in the writing power supply line V2 is not applied to the unselected first bit lines BL12 and so on, and a constant pre-charge voltage $V_{PRE}$ is applied via the transistors in the second voltage applying circuit 102, and therefore, the voltage does not fluctuate. Accordingly, no disturbance corresponding to "common line disturbance" is caused in the unselected memory cells R21 and so on arranged in the row direction along the selected word line WL1.

Accordingly, the device 1 of the present invention can carry out a writing operation while suppressing the above-described writing disturbance in the conventional 1T1R type memory cell array, where each cell has one variable resistive element and one transistor.

Although a writing operation in the case where one memory cell in the device 1 of the present invention is selected and the variable resistive element is written is described in the above, it is clear that a number of memory cells connected to the same word line can be selected so that a setting or resetting operation can be collectively and simultaneously carried out on the variable resistive elements, and in this case also, the writing disturbance is not caused.

Figure 3:
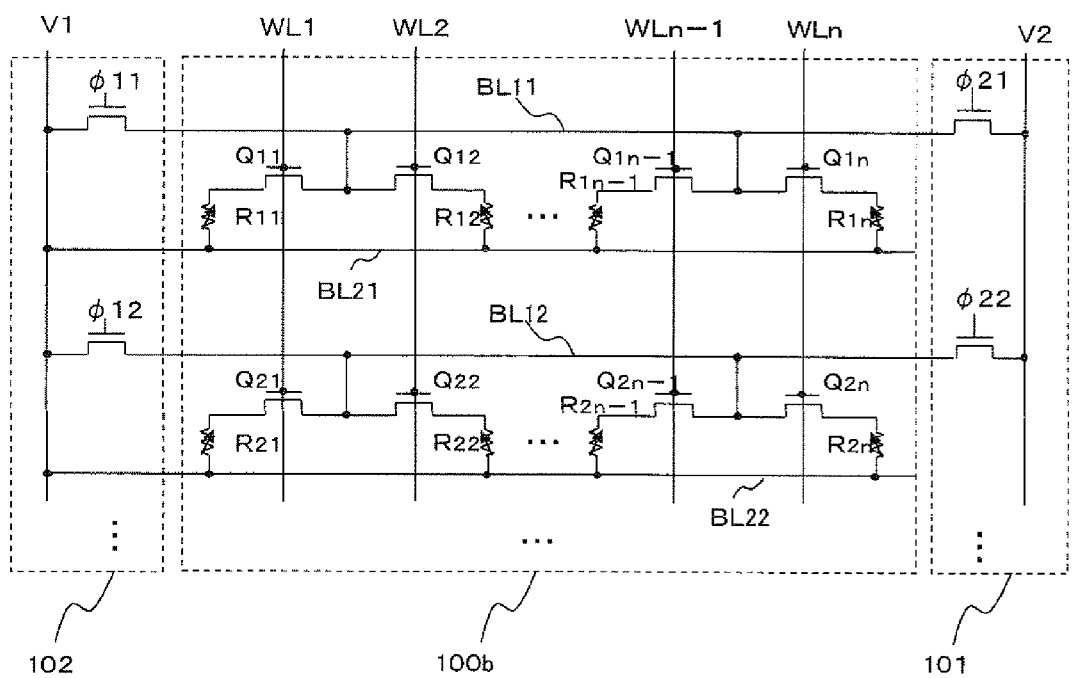
FIG. 3 is a diagram showing another example of the circuit structure of the semiconductor memory device according to the present invention.

In addition, although the device 1 of the present invention has a structure including the memory cell array 100 in which one second bit line is mutually shared by two memory cell columns which are adjacent in the row direction, by connecting the variable resistive elements R11 to R1n and R21 to R2n arranged in the column direction to the mutual second bit line BL21, in the structure of the memory cell array of the device 1 of the present invention, a structure including a memory cell array 100b having one second bit line extending in the column direction for each of the memory cell columns as shown in FIG. 3 may be employed instead. The timing and operation for writing, as well as the effects against writing disturbance, are the same as in FIGS. 1 and 2.

Figure 4:
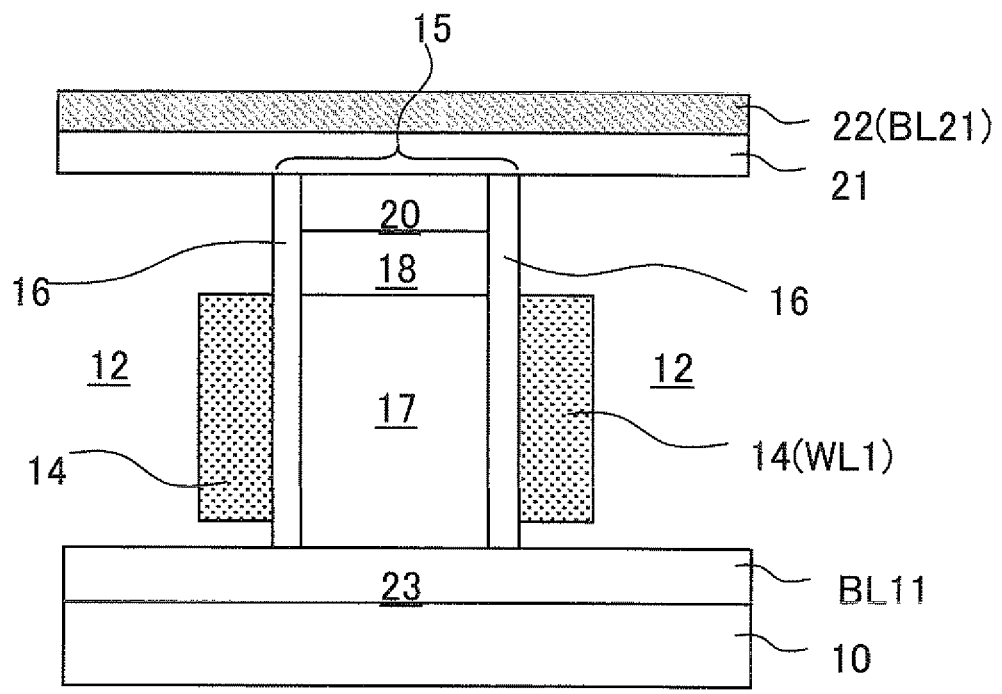
FIG. 4 is a diagram showing a cross sectional structure of a memory cell of the semiconductor memory device according to the present invention.

Each of the transistors for selecting a memory cell Q11 to Q1n, Q21 to Q2n is formed of a vertical transistor. A structural cross sectional diagram of an example of a memory cell having the vertical transistor is shown in FIG. 4. FIG. 4 is a cross sectional diagram of a memory cell of the device 1 of the present invention seen from the row direction (extending direction of the word lines). Hereinbelow, an explanation will be given with this memory cell being the memory cell that is identified by the word line WL1 and the first bit line BL11 at the upper left portion of FIG. 1 as an example.

On a silicon substrate 10, the first bit line BL 11 extending in the column direction (lateral direction of FIG. 4) is formed, and on the first bit line BL 11, a tube 15 having a depth penetrating an interlayer insulating film 12 and a gate electrode 14 formed of polycrystal silicon and reaching the first bit line BL11 is formed. The first bit line BL11 is for example an impurity silicon layer, and is formed of a diffusion layer doped with an n-type impurity in high concentration.

A side wall of the tube 15 is covered with a gate insulating film 16, and inside the tube 15, a channel region 17 and a drain region 18 of the transistor are further formed in a tube shape. The channel region 17 and the drain region 18 are for example a p-type silicon layer and an n-type silicon layer formed by an epitaxial growth on the first bit line BL11 exposed within the tube 15, respectively. An outer circumferential wall surface of the tube shaped channel region 17 is covered by the gate electrode 14 via the gate insulating film 16, and with the first bit line connected to the channel region 17 at a tube bottom surface functioning as an n-type source region 23, the channel region 17 connects to the source region 23 at its bottom surface, connects to the drain region 18 at its top surface, and further connects to the gate electrode 14 via the gate insulating film 16 at its side wall surface, thereby forming a surround gate transistor. On the other hand, the gate electrode 14 extends in the row direction, thereby forming the word line WL1.

On the drain region 18, a lower electrode 20 of a variable resistive element is formed to fill the tube 15, and on this lower electrode 20, a variable resistive body 21 extending in the column direction and an upper electrode 22 of the variable resistive element are formed by using the same mask pattern. The upper electrode 22 forms the second bit line BL21 extending in the column direction.

Figure 5:
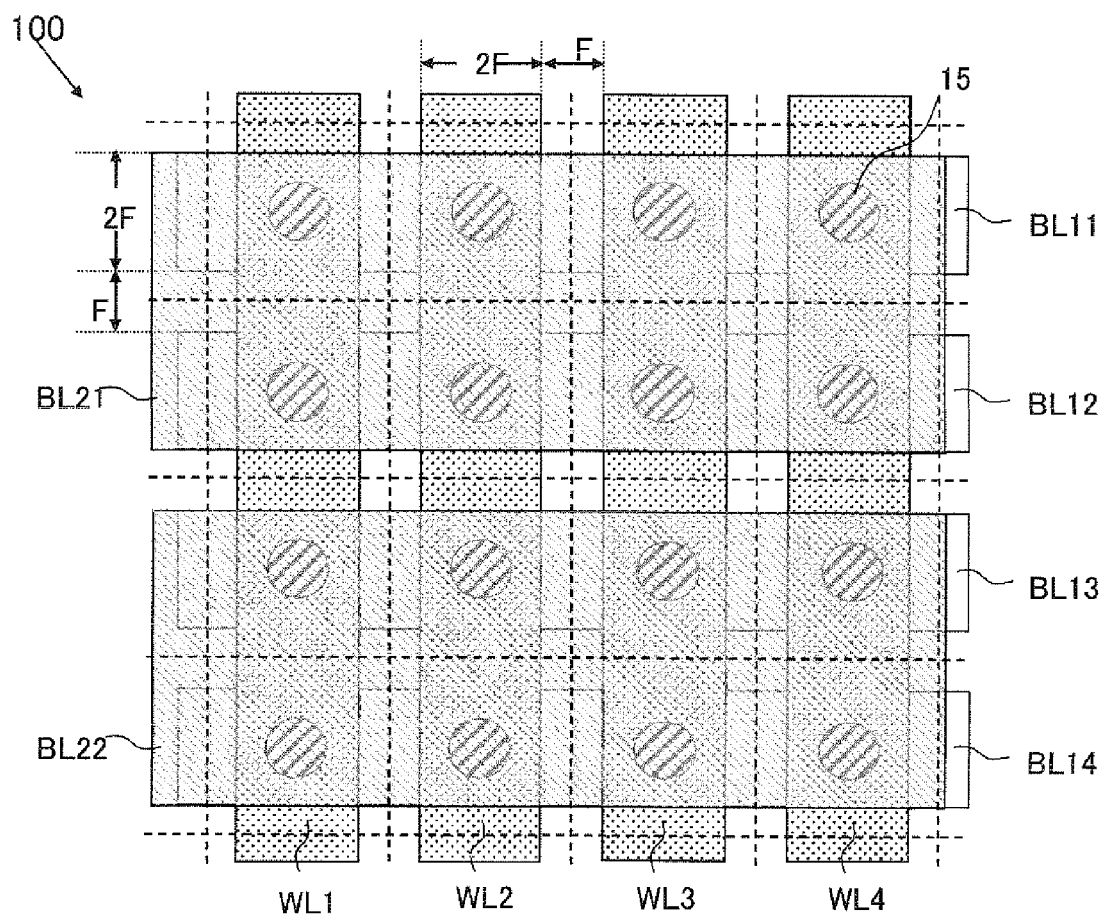
FIG. 5 is a layout diagram of a memory cell array of the semiconductor memory device according to the present invention.

A layout diagram of the memory cell array of the device 1 of the present invention is shown in FIG. 5. A width of the tube by which the vertical transistors are formed is preferably F. Here, F is a minimum processing dimension in a manufacturing process. Further, the shapes of the top surface and the bottom surface of the tube are not limited to circles; they may be formed in polygonal shapes. A line width of the word lines and the first bit lines is 2F, and intervals thereof are 1F, respectively. In this layout, an occupying area per one memory cell has a width in an X direction (column direction) of 3F and a width in a Y direction (row direction) of 3F, thus is $3F \times 3F = 9F^2$.

Figure 6:
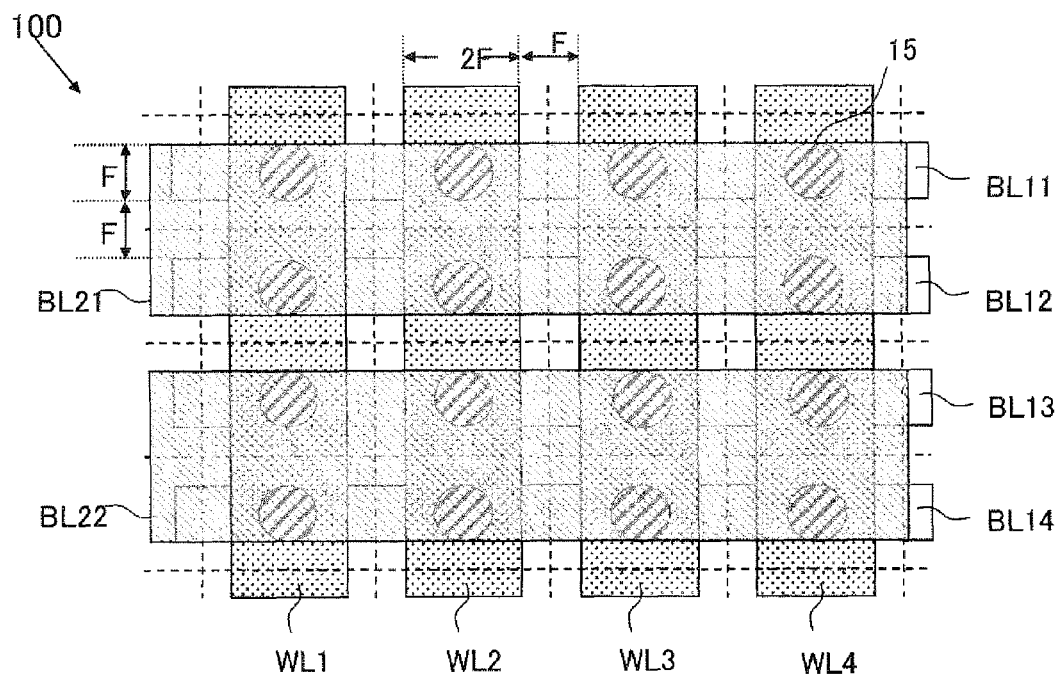
FIG. 6 is a layout diagram of the memory cell array of the semiconductor memory device according to the present invention.

Furthermore, by omitting a design margin for a process of contacting the first bit line and the tube, the line width of the first bit line can be made at 1F. A layout diagram of the memory cell array of the device 1 of the present invention in such a case is shown in FIG. 6. In this layout, the occupying area per one memory cell has a width in the X direction (column direction) of 3F and a width in the Y direction (row direction) of 2F, thus is $3F \times 2F = 6F^2$.

Figure 7:
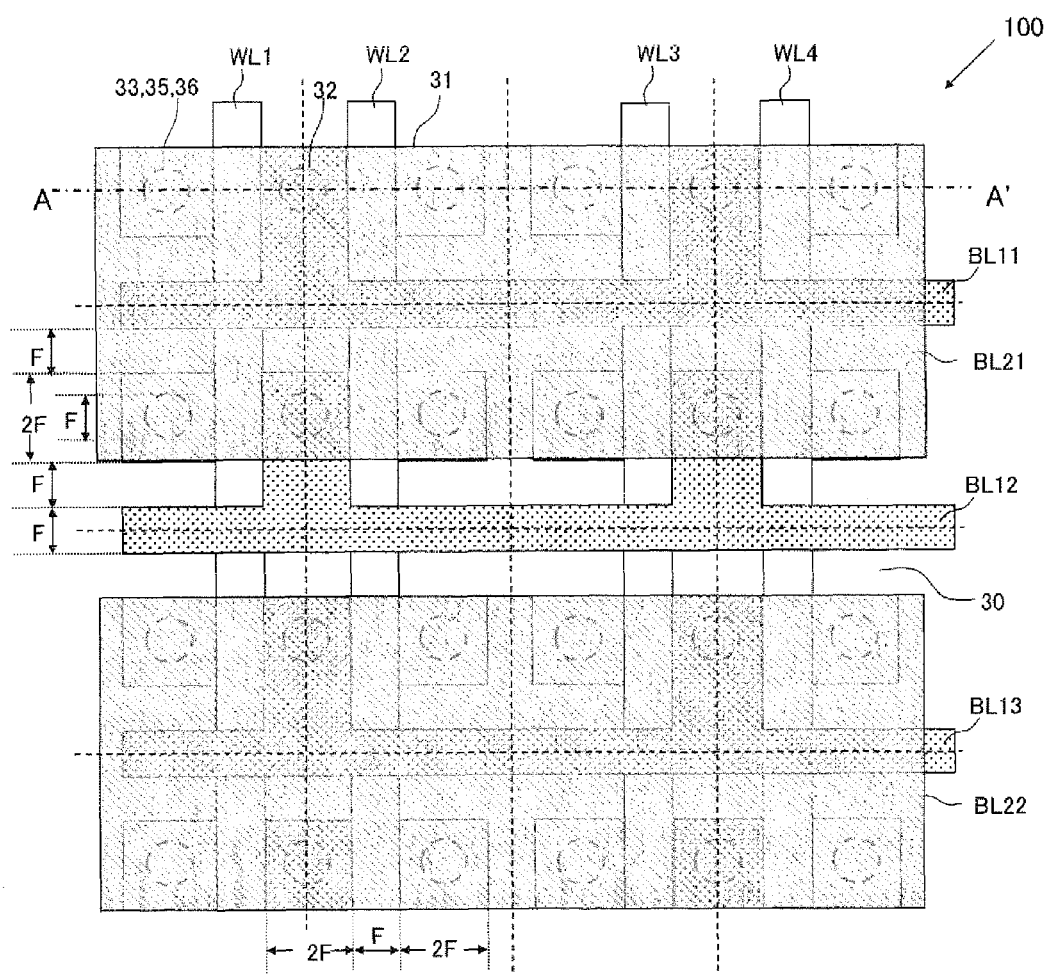
FIG. 7 is a layout diagram of the memory cell array of the semiconductor memory device according to the present invention.
Figure 8:
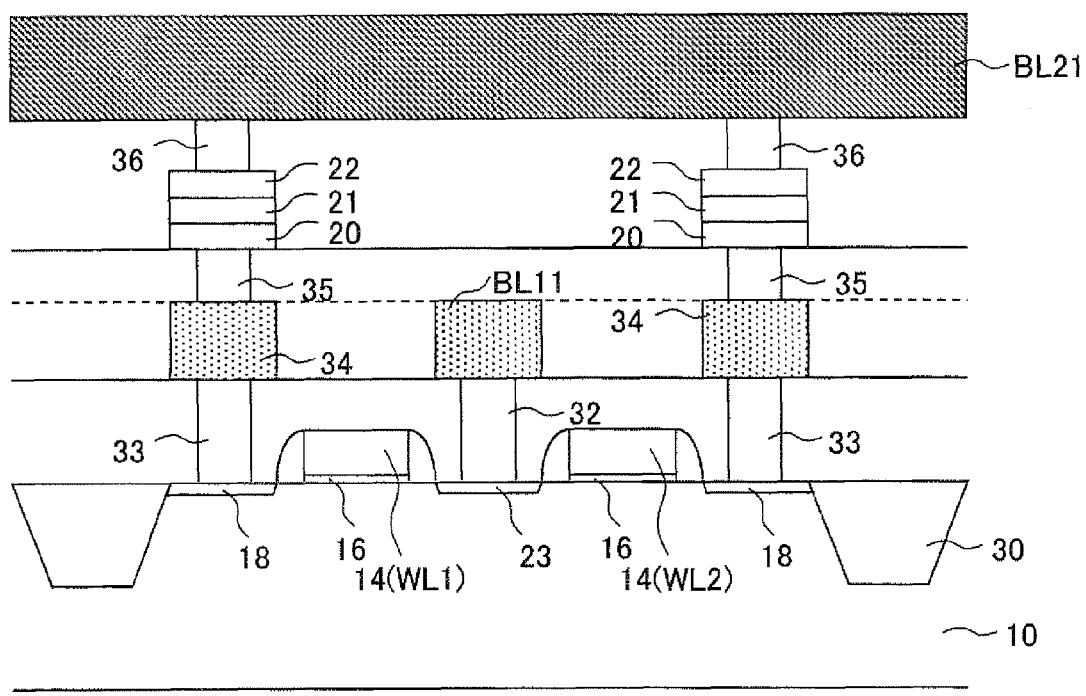
FIG. 8 is a diagram showing a cross sectional structure of the memory cell array of the semiconductor memory device according to the present invention.
Figure 9:
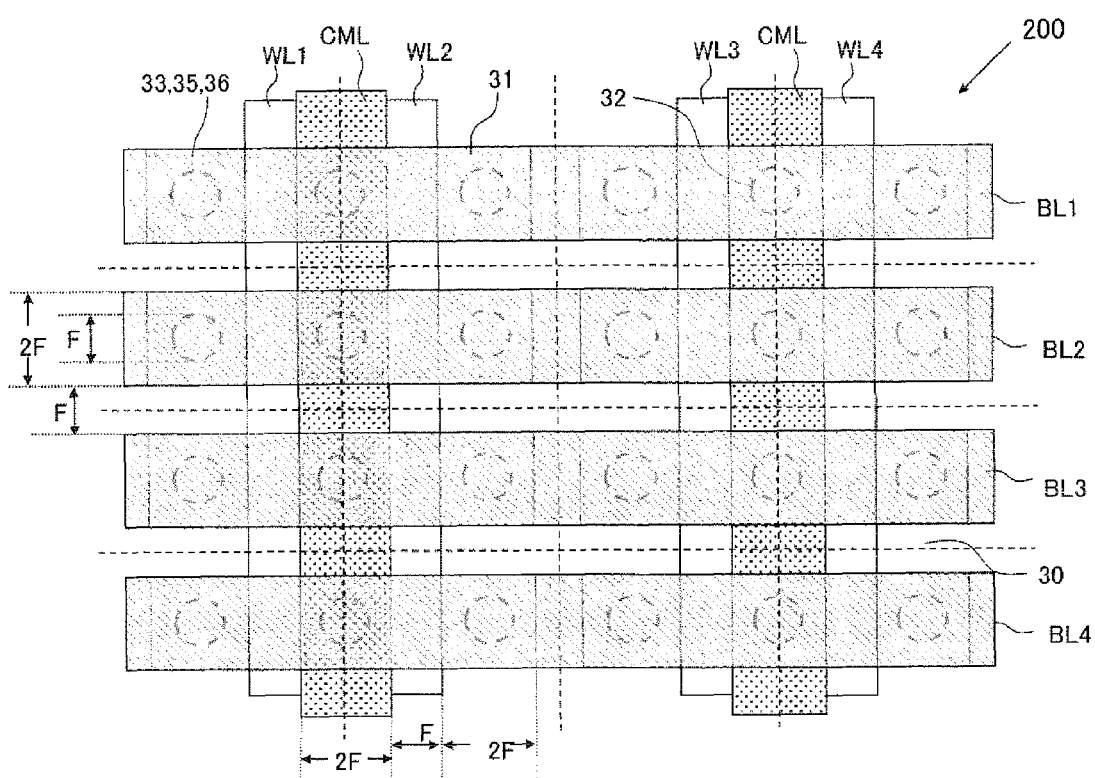
FIG. 9 is a layout diagram of the memory cell array of a conventional semiconductor memory device.

On the other hand, a layout of the memory cell array in a case of forming the device 1 of the present invention using conventional MOS transistors is shown in FIG. 7. Further, a structural cross sectional diagram along A-A' plane of FIG. 7 in which the memory cell is seen from the row direction (the extending direction of the word lines) is shown in FIG. 8. Further, a layout of a conventional memory cell array, in which the conventional MOS transistors are used and the bit lines and the common line cross orthogonally is shown in FIG. 9. In the memory cell array of the device 1 of the present invention using the conventional MOS transistors, as shown in FIG. 8, in an active region 31 defined by an element separating region 30 on the substrate 10, a MOS transistor as the selected transistor is formed and connected to the word line WL1 (WL2) in which gate electrodes 14 are extended in the row direction (direction vertical to a sheet surface). A source region 23 of the transistor is connected to the first bit line BL11 extending in the column direction (lateral direction of FIG. 8) via a through hole 32, and a drain region 18 of the transistor is connected to a variable resistive element formed of a lower electrode 20, a variable resistive body 21 and an upper electrode 22 via a through hole 33, an island shaped metal wiring layer 34 and a through hole 35. The variable resistive element is connected to the second bit line BL 21 extending in the column direction (lateral direction of FIG. 8) via a through hole 36.

In the memory cell array using the MOS transistor as above, since it has a structure in which the first bit lines and the second bit lines extend in parallel, the first bit lines and the second bit lines respectively need to be formed in different wiring layers such that one avoids the other. Due to this, the occupying area of the memory cell array increases by a region needed for the aforementioned avoidance. As shown in FIG. 7, the occupying area per one memory cell has a width in the X direction (column direction) of 4.5F and a width in the Y direction (row direction) of 5F, thus is $4.5F \times 5F = 22.5F^2$. Contrary to this, in the conventional memory cell array in which the bit lines and the common line cross orthogonally as shown in FIG. 9, the occupying area per one memory cell has a width in the X direction (column direction) of 4.5F and a width in the Y direction (row direction) of 3F, thus is $4.5F \times 3F = 13.5F^2$.

However, in the present invention, by utilizing the vertical transistors, the occupying area per one memory cell can be made smaller than that of the conventional memory cell array in which the bit lines and the common line cross orthogonally. That is, the above circuit structure in which the disturbance is suppressed is employed, and at the same time, it becomes possible to make the cell array area smaller than that in the conventional technique.

It should be noted that, in the above embodiment, although a structure in which the occupying area per one memory cell is $9F^2$ is shown in FIG. 5 and a structure having that of $6F^2$ is shown in FIG. 6, these do not limit the memory cell size to the aforementioned sizes. By omitting the design margin for the process of contacting the word line and the tube and forming the word lines with the line width of 1F, it is possible to manufacture a memory cell array having an occupying area per one memory cell of $4F^2$.

According to the above, by the device 1 of the present invention, a semiconductor memory device in which the writing disturbance is suppressed, the reliability in holding data is high and the memory cell array area is reduced is implemented. By employing the aforementioned device 1 of the present invention in, for example, a non-volatile memory installed in an electric apparatus such as a cell phone, a digital camera, a digital audio recorder, a DVD device, a color adjusting circuit of a liquid crystal display device, a music recording and playing device, a video system, an audio system, or a copier, the chip can be made smaller, and an electric apparatus with a high reliability can be provided. More specifically, by installing the device 1 of the present invention in the cell phone and use it for storing image data as well as communication protocols, the quality of the cell phone can be dramatically improved.

Other Embodiments

Other embodiments are described below.

Figure 10:
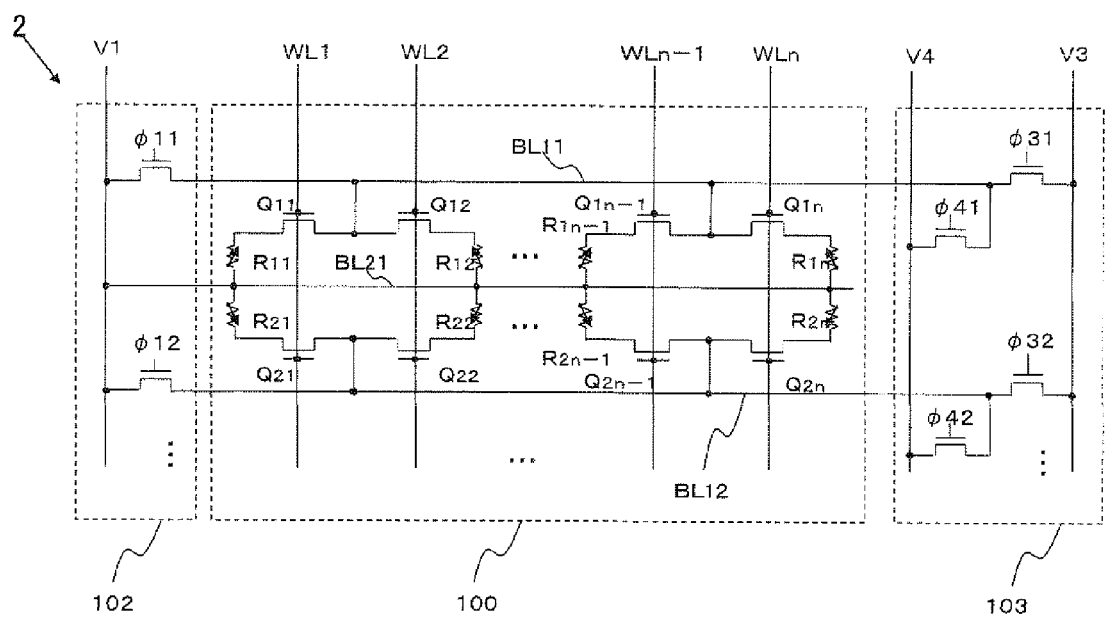
FIG. 10 is a diagram showing a circuit structure of another embodiment of the semiconductor memory device according to the present invention.

(1) Although the above embodiment has a structure in which the first voltage applying circuit supplies the writing voltage for writing information stored in the variable resistive element in the selected memory cell to the first bit line connected to the respective selected memory cell via the writing power supply line V2, a plurality of writing power supply lines may be provided. FIG. 10 shows a circuit structure of a semiconductor memory device of another embodiment of the present invention (hereinbelow referred to as "the device 2 of the present invention"). In the device 2 of the present invention, a first voltage applying circuit 103 includes two writing power supply lines, namely a first writing power supply line V3 and a second writing power supply line V4, and is configured to supply the writing voltage to the first bit line connected to each of the selected memory cells via the first writing power supply line V3 or the second writing power supply line V4. As for the configurations of the memory cell array 100 and the second voltage applying circuit 102, the explanation thereof will be omitted because they are identical to those of the device 1 of the present invention. The configuration of the word line voltage applying circuit (not shown) is also identical to that of the device 1 of the present invention, thus the explanation thereof will be omitted.

The first writing power supply line V3 and each of the first bit lines are connected via a transistor for switching, and the first bit line to which the writing voltage is to be applied can be selected by a switching signal φ31, φ32 and so on. Similarly, the second writing power supply line V4 and each of the first bit lines are connected via a transistor for switching, and the first bit line to which the writing voltage is to be applied can be selected by a switching signal φ41, φ42 and so on. The writing voltage applied in the first writing power supply line V3 and the writing voltage applied in the second writing power supply line V4 are different, and according to this, for a plurality of variable resistive elements connected to different first bit lines, one of the writing voltage applied in the first writing power supply line V3 and the writing voltage applied in the second writing power supply line V4 can be selected based on the switching signals φ31, φ32 and so on and φ41, φ42 and so on, and apply the same simultaneously thereto.

Figure 11:
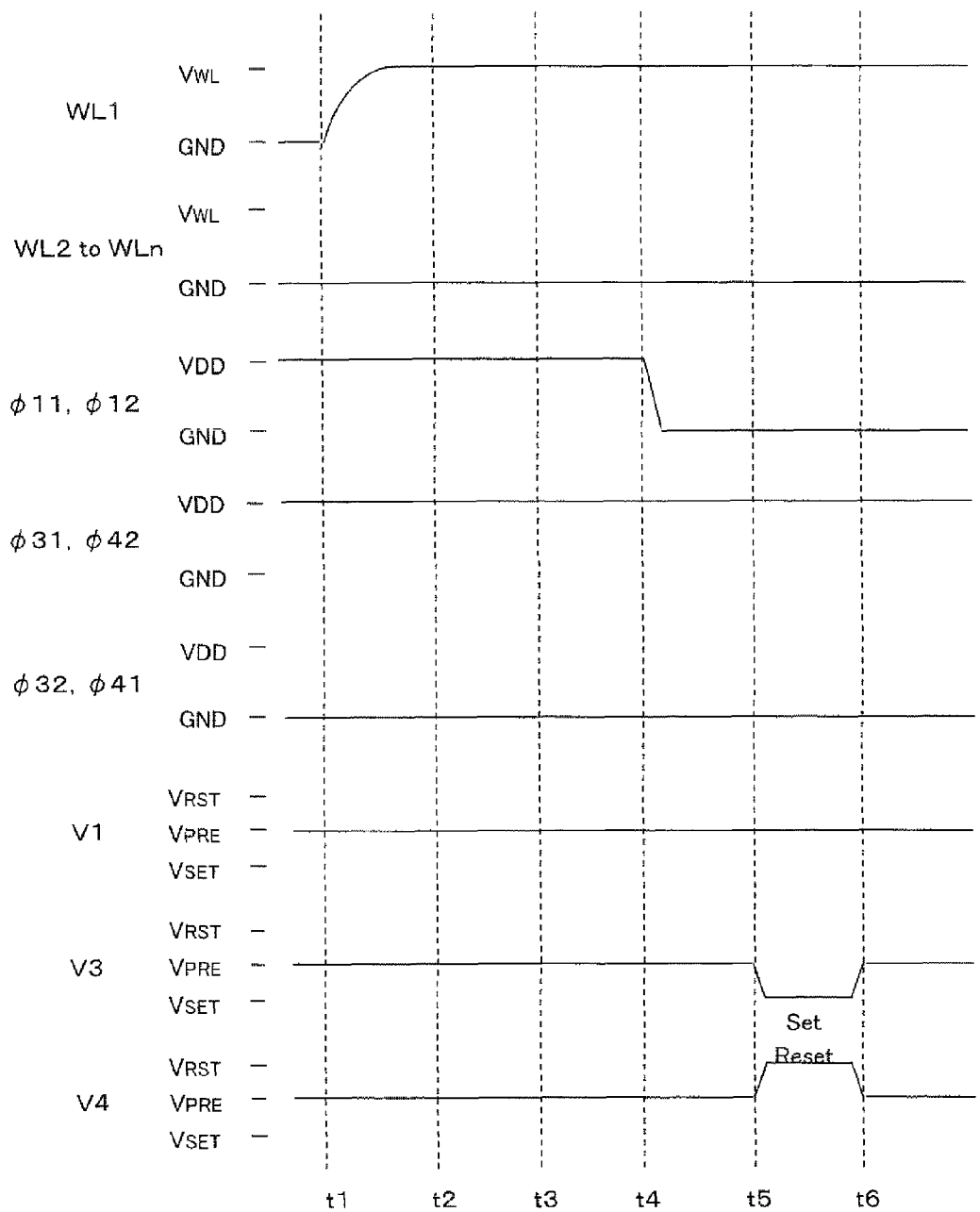
FIG. 11 is a timing chart upon writing in the other embodiment of the semiconductor memory device according to the present invention.
Figure 12:
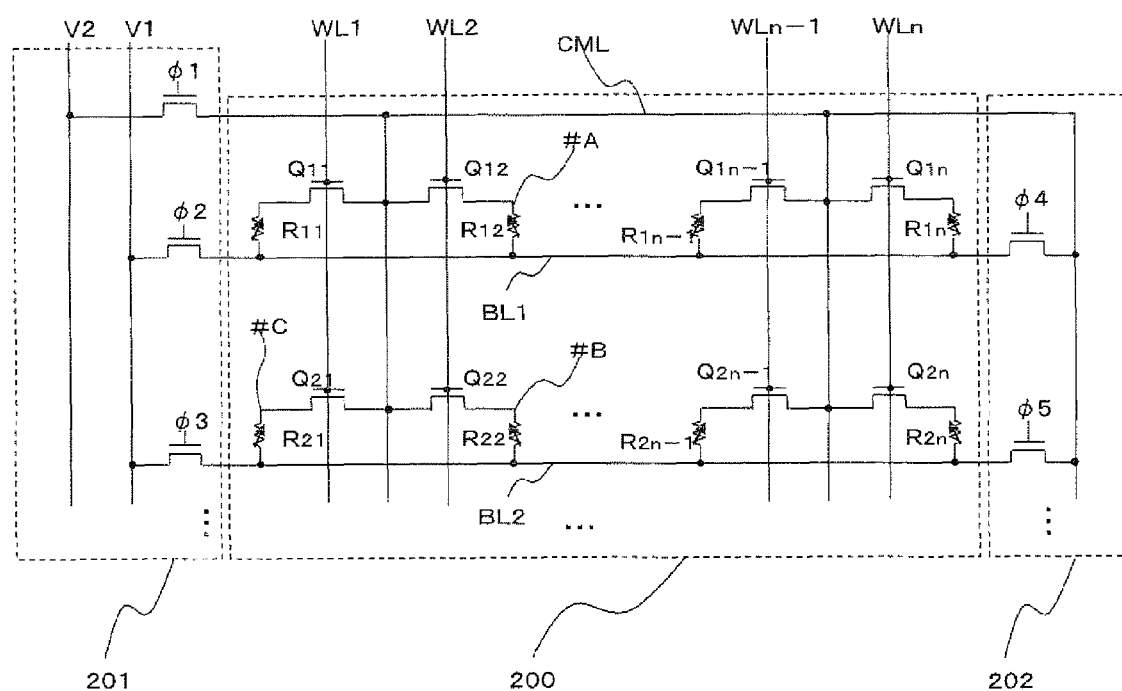
FIG. 12 is a diagram showing a circuit structure of the conventional semiconductor memory device.
Figure 13:
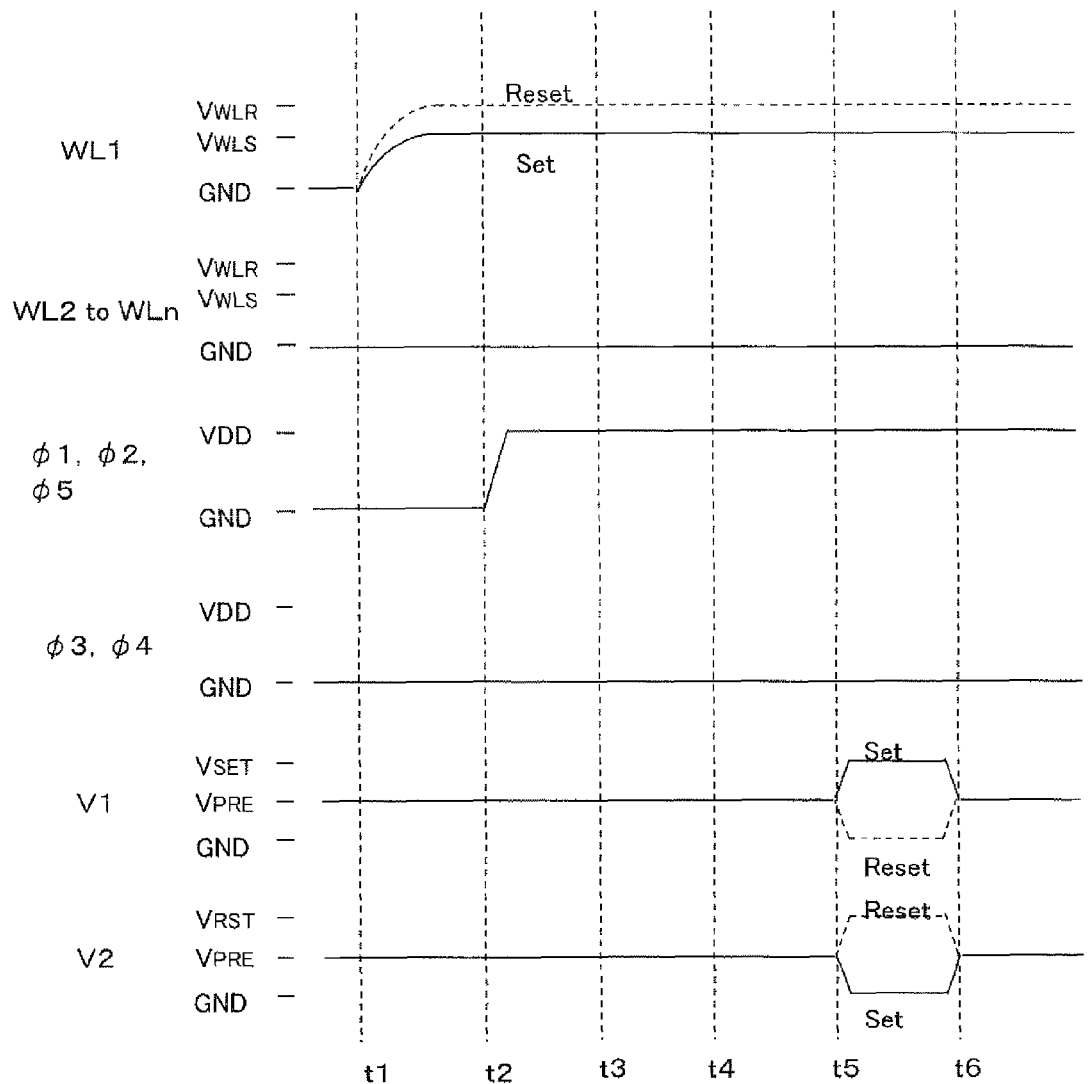
FIG. 13 is a timing chart upon writing in the conventional semiconductor memory device.
Figure 14:
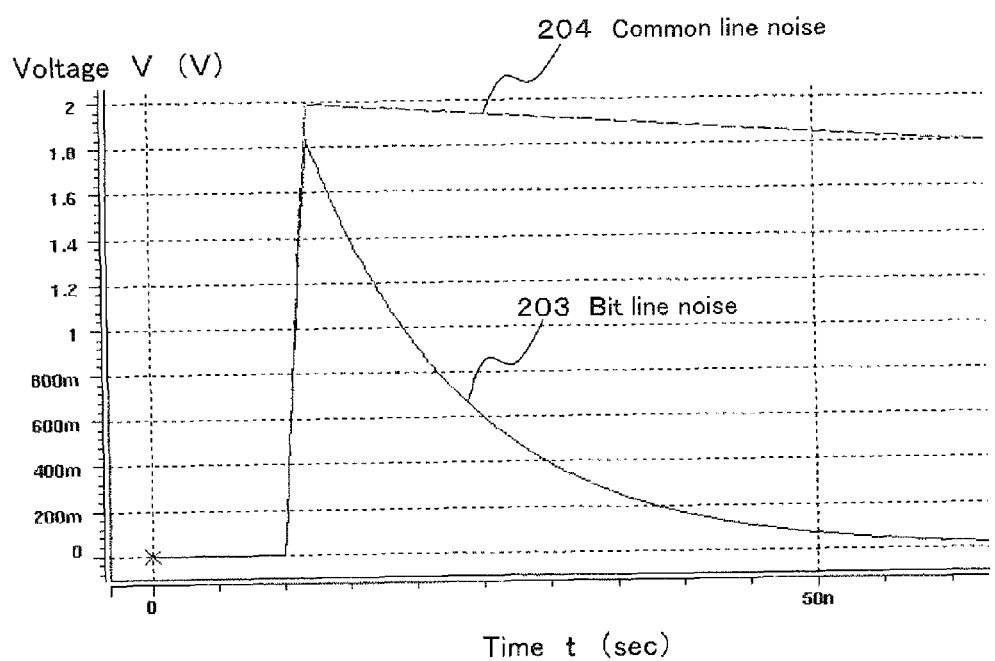
FIG. 14 is a diagram showing a simulation of a writing disturbance in the conventional semiconductor memory device.

FIG. 11 shows a timing chart of voltage signals upon writing in the device 2 of the present invention for the word lines WL1 to WLn, the switching signals φ11, φ12 and so on, φ31, φ32 and so on, and φ41, φ42, the pre-charge power supply line V1, the first writing power supply line V3, and the second writing power supply line V4. Unlike the first embodiment in which the selected word line voltage differ in the setting operation and the resetting operation, same word line voltage $V_{WL}$ can be used in both the setting operation and the resetting operation. Accordingly, for a plurality of variable resistive elements connected to same word line and different first bit lines, the setting operation and the resetting operation can respectively be performed simultaneously. Here, an explanation will be given in an exemplary case of setting R11 and resetting R12.

First, φ11, φ12 and so on are raised, voltage $V_{PRE}$ (typically 3 V) of the pre-charge power supply line V1 is applied directly to the second bit line, and is also applied to the first bit lines via the switching transistor of a second voltage applying circuit 102. Further, by raising φ31 and φ42 and lowering φ32, φ41, the voltage $V_{PRE}$ from the first writing power supply line V3 is applied to the first bit line BL11 and the voltage $V_{PRE}$ from the second writing power supply line V4 is applied to the first bit line BL12 via a transistor of a first voltage applying circuit 103, and all of the memory cells are beforehandedly precharged to $V_{PRE}$.

After having raised the word line WL1 to voltage $V_{WL}$ (typically 6 V) at time t1, φ11 and φ12 are lowered at time t4, and the precharging operation is terminated. Moreover, in order to prevent the writing voltage pulse from the first voltage applying circuit 103 from being applied to first bit lines connected to memory cells that are not to be written, transistors for switching connected to those first bit lines are turned off.

Next, at time t5 to t6, pulse voltage is applied to the first writing power supply line V3 and the second writing power supply line V4. That is, the first writing power supply line V3 for the setting operation is changed to the voltage $V_{SET}$ (typically 0 V), current is caused to flow toward the selected first bit line BL11 from the selected second bit line BL21 via R11 and Q11, and the setting operation of the variable resistive element R11 is performed. On the other hand, the second writing power supply line V4 for the resetting operation is changed to the voltage $V_{RST}$ (typically 6 V), current is caused to flow toward the selected second bit line BL21 from the selected first bit line BL12 via Q21 and R21, and the resetting operation of the variable resistive element R21 is performed.

In the other embodiment above, the pre-charge voltage is set as an intermediate voltage between the writing voltage applied in the first writing power supply line V3 and the writing voltage in the second writing power supply line V4, polarity of the writing voltage applied to the first bit line with the pre-charge voltage as the reference voltage can be made to differ between the case of the writing voltage being supplied from the first writing power supply line V3 and the case of the same being supplied from the second writing power supply line V4; and, the polarity of the writing voltage pulse applied to the variable resistive element of the selected memory cell can be reversed in the case of the writing voltage being supplied from the first writing power supply line from that in the case of the same being supplied from the second writing power supply line.

Further, due to the same reason as the first embodiment, the three types of writing disturbances that conventionally had been difficult to prevent can all be prevented, and for the plurality of variable resistive elements connected to the same word line and the different first bit lines, the setting operation and the resetting operation can respectively be performed simultaneously. Further, by using the vertical transistors, the array occupying area of the memory cell array 100 can be made small.

(2) In the first embodiment above, the second bit lines are directly connected to the pre-charge power supply line V1 of the second voltage applying circuit without intervening any transistors for switching, however, such transistors for switching may be provided between the respective second bit lines and the pre-charge power supply line, and the second bit lines and the pre-charge power supply line may be connected via these transistors. By using all of these transistors in an on-state, the writing disturbance can be prevented and the writing operation can be performed like the first embodiment. Further, by configuring to enable the selection of the second bit line to which the pre-charge voltage is to be applied based on the switching signals, the memory cell to which the pre-charging operation is to be performed can be selected. In such a case, in the writing operation of the selected memory cell, the pre-charge voltage may be applied, via the transistors for switching, only to the second bit line connected to this selected memory cell and the first bit lines to which memory cells connected to this second bit line are connected; and, as for other unselected memory cells that are not connected to the second bit line of the selected memory cell, the transistors for switching in the first bit lines and the second bit lines to which these unselected memory cells are connected may all be turned off so that the voltages from the pre-charge power supply line V1 and the writing power supply line V2 are not applied. According to this, by selecting the memory cells to which the precharging operation is necessary and applying the pre-charge voltage only to those memory cells, power consumption of a driving circuit supplying the pre-charge voltage can be reduced.

(3) In the first embodiment and the other embodiment above, the pulse voltage for writing is supplied from the writing power supply line V2, or V3 and V4, however, a predetermined writing voltage may be supplied to these writing power supply lines, and a pulse signal may be given to the transistor for switching that is connected to the selected bit line so as to supply the writing voltage pulse to the selected bit line. Specifically, in the writing timing chart shown in FIG. 2, a fixed voltage $V_{SET}$ or a reset voltage $V_{RST}$ may be supplied constantly to the writing power supply line V2, and by raising φ21 only during the time t5 to t6 thereby to turn on the transistor for switching, the writing voltage pulse can be applied to the selected bit line BL11.

The present invention can be applied to semiconductor memory devices, and in particular, used for nonvolatile memories in electronic apparatuses that require a high level of reliability in writing, such as cellular phones and digital cameras.

Although the present invention has been described in terms of the preferred embodiment, it will be appreciated that various modifications and alternations might be made by those skilled in the art without departing from the spirit and scope of the invention. The invention should therefore be measured in terms of the claims which follow.

What is claimed is:

1. A semiconductor memory device, comprising:
a memory cell array including a plurality of memory cells arranged in a matrix shape in a row direction and a column direction, each memory cell comprising a memory element and a cell transistor, wherein the memory element has two input/output terminals so that information is stored using a difference in electrical properties between the two terminals and the stored information is written by applying a writing voltage across the two terminals, the cell transistor has two input/output terminals and one control terminal, and a first end of the input/output terminals of the memory element and a first end of the input/output terminals of the cell transistor are connected;
word lines extending in the row direction for connecting the control terminals of the cell transistors in the memory cells arranged in same rows to each other;
first bit lines extending in the column direction for connecting second ends of the input/output terminals of the cell transistors in the memory cells arranged in same columns to each other, the second ends of the input/output terminals of the cell transistors being not connected to the memory elements;
second bit lines extending in the column direction for connecting second ends of the input/output terminals of the memory elements in the memory cells to each other, the second ends of the input/output terminals of the memory elements being not connected to the cell transistors;
a word line voltage applying circuit for applying a voltage to the word line connected to the memory cell selected to be written;
a first voltage applying circuit for applying the writing voltage to the first bit line connected to the selected memory cell; and
a second voltage applying circuit for applying a pre-charge voltage to both the first bit line and the second bit line connected to the selected memory cell before application of the writing voltage, and applying the pre-charge voltage to the second bit line connected to the selected memory cell while the writing voltage is applied to the first bit line connected to the selected memory cell, wherein
each of the cell transistors is a vertical field effect transistor including the first end of the input/output terminals, a channel region, and the second end of the input/output terminals arranged in a third direction that is vertical to the row direction and the column direction,
in each of the memory cells, the memory element and the cell transistor are arranged in the third direction, and
the word lines, the first bit lines, and the second bit lines are formed apart from each other in the third direction.

2. The semiconductor memory device according to claim 1, wherein
each of the first bit lines includes a diffusion layer.

3. The semiconductor memory device according to claim 1, wherein
the cell transistor is a surround-gate transistor including a source region, a drain region, the channel region having a tube shape, a tube-shaped gate insulating film covering an outer circumferential wall surface of the channel region, and a gate electrode covering an outer circumferential wall surface of the gate insulating film, wherein the source region and the drain region connect to the channel region at a bottom surface and a top surface of the channel region, respectively.

4. The semiconductor memory device according to claim 1, wherein
the cell transistor connects to the first bit line at its bottom surface and connects to the first end of the input/output terminals of the memory element at its top surface, and
the second end of the input/output terminals of the memory element is connected to the second bit line.

5. The semiconductor memory device according to claim 1, wherein
the second voltage applying circuit includes a pre-charge power supply line to which the pre-charge voltage is applied, and
the pre-charge power supply line is directly connected to each of the second bit lines and connected to each of the first bit lines via a first transistor provided for each of the first bit lines.

6. The semiconductor memory device according to claim 1, wherein
the first voltage applying circuit includes a writing power supply line to which the writing voltage is applied, and
the writing power supply line is connected to each of the first bit lines via a second transistor provided for each of the first bit lines.

7. The semiconductor memory device according to claim 1, wherein
the first voltage applying circuit includes a first writing power supply line and a second writing power supply line to which the writing voltages different from the pre-charge voltage are respectively applied, the first writing power supply line is connected to each of the first bit lines via a third transistor provided for each of the first bit lines, and the second writing power supply line is connected to each of the first bit lines via a fourth transistor provided for each of the first bit lines.

8. The semiconductor memory device according to claim 1, wherein each of the memory elements is a variable resistive element of which a resistance state represented by a resistance property between the two input/output terminals of the memory element transitions through the application of the writing voltage.

* * * * *